United States Patent [19]

LaFiandra et al.

[11] Patent Number: 4,617,681
[45] Date of Patent: Oct. 14, 1986

[54] BISTABLE ALIGNER CARTRIDGE FOOT

[75] Inventors: Carlo LaFiandra, New Canaan; Justin Kreuzer, Trumbull, both of Conn.

[73] Assignee: The Perkin-Elmer Corporation, Norwalk, Conn.

[21] Appl. No.: 605,941

[22] Filed: May 1, 1984

[51] Int. Cl.$^4$ .................... G21K 5/00; A61B 6/08
[52] U.S. Cl. .................... 378/34; 378/205; 378/208
[58] Field of Search .......... 378/34, 35, 205, 208; 254/45, 423; 269/58; 250/491.1

[56] References Cited

U.S. PATENT DOCUMENTS 4,525,852  6/1985  Rosenberg .................... 378/34

Primary Examiner—Craig E. Church
Assistant Examiner—Charles Wieland
Attorney, Agent, or Firm—Richard C. Wilder; Thomas P. Murphy; Edwin T. Grimes

[57] ABSTRACT

The present invention is directed, in an X-ray lithographic system characterized by a plurality of work stations, a cartridge, apparatus for mounting a wafer and a mask on the cartridge, a system for moving the cartridge between stations, apparatus in each of the stations for moving the cartridge to a kinematic mount, said kinematic mounts in all of said stations being substantially identical, to the improvement comprising: a bistable foot operable in a first linear elevational mode and in a second angular compliance mode.

4 Claims, 5 Drawing Figures

BISTABLE ALIGNER CARTRIDGE FOOT

FIELD OF INVENTION

This invention relates to alignment apparatus and, more particularly, to a bistable aligner cartridge foot. The invention is particularly adapted among many other possible uses for use in systems for replicating integrated circuit patterns.

The application is closely related to U.S. patent application Ser. No. 568,775 filed Jan. 6, 1984 entitled X-ray Lithographic System. Said application is assigned to the same Assignee as the present application, and the disclosure contained therein is incorporated herein by reference.

BACKGROUND OF INVENTION

A particularly desirable X-ray lithographic system is known which is characterized by a plurality of work stations, a cartridge in which a wafer and mask are mounted, and an apparatus for moving the cartridge between stations. The system further includes apparatus for moving the cartridge within each station to a kinematic mount. The kinematic mounts in all of the stations are substantially identical.

In more detail, the cartridge in said X-ray lithographic system holds the X-ray mask and wafer, and is adapted to travel on air bearings for transportation between stations. When located in any one of the stations, it is moved upwardly into a kinematic mount i.e. three sets of balls and mating radial V-blocks. The V-blocks at each station are all substantially identical and, as a result, the cartridge when subjected to the same loading takes the same mechanical deformation at each station. The same pistons are used at each station for raising the cartridge, thereby providing a repeatable controlled force between the V-blocks and the balls.

The present invention is directed to improvements over such X-ray lithographic systems, as will become apparent as the description proceeds.

SUMMARY OF THE INVENTION

In an X-ray lithographic system characterized by a plurality of work stations, a cartridge, means for mounting a wafer and a mask on said cartridge, means for moving said cartridge between said stations, means in each of said stations for moving said cartridge to a kinematic mount, said kinematic mounts in all of said stations being substantially identical; the improvement residing in the provision of a new and improved bistable foot operable in a first linear elevational mode and in a second angular compliance mode.

According to one aspect of the invention the bistable foot comprises first piston means for elevating the cartridge with respect to said support means, and second piston means operable between a first mode wherein said cartridge is rigidly connected to said support means and a second mode wherein said cartridge is flexibly connected to the support means.

There has thus been outlined rather broadly the more important features of the invention in order that the detailed description thereof that follows may be better understood, and in order that the present contribution to the art may be better appreciated. There are, of course, additional features of the invention that will be described more fully hereinafter. Those skilled in the art will appreciate that the conception on which this disclosure is based may readily be utilized as the basis of the designing of other systems for carrying out the various purposes of the invention. It is important, therefore, that this disclosure be regarded as including such equivalent systems as do not depart from the spirit and scope of the invention.

One embodiment of the invention has been chosen for purposes of illustration and description and is shown in the accompanying drawings forming a part of the specification.

DETAILED DESCRIPTION OF A PRESENTLY PREFERRED EMBODIMENT

Briefly, the X-ray lithographic system comprises a plurality of work stations, a cartridge, and means for mounting a wafer and a mask on the cartridge. In addition, the system includes means for moving the cartridge between work stations, means in each of said stations for moving the cartridge to a kinematic mount, said kinematic mounts in all of said stations being substantially identical. This system is described in the above-identified patent application Ser. No. 568,775.

Figure 1:
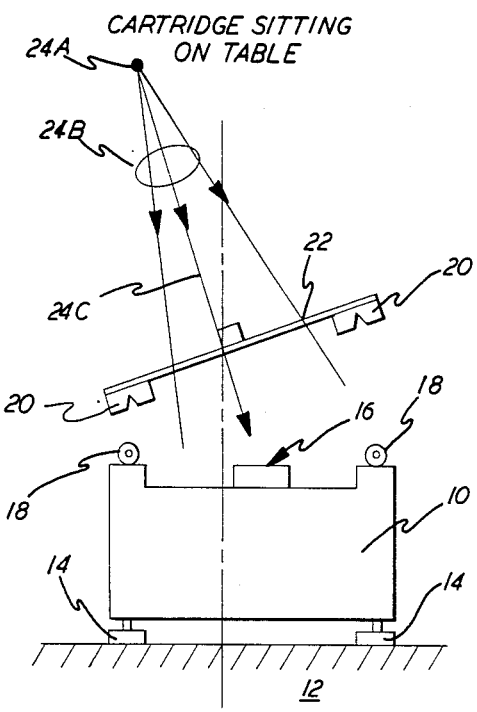
FIG. 1 is a side elevation of a cartridge sitting on a support table.

FIG. 1 of the present application shows a cartridge 10 mounted on a support table 12 by means of three spaced bistable feet 14. FIG. 1 shows the bistable feet in their rigid position or mode. The cartridge carries a mask and wafer arrangement indicated at 16. Mounted at the upper end of the cartridge 10 are three equally spaced kinematic mounts, which in the illustrated form are balls 18 that are received by mating "V"-blocks 20 carried by a reaction plate 22. A cone of X-rays originating from point 24A is indicated by rays 24B, with ray 24C being the central ray, which is perpendicular to the plate 22. It will be appreciated that the reaction plate 22 and the center of the mask and wafer arrangement 16 when raised must be perpendicular to ray 24C. One feature of the present invention is the provision of ways and means for accommodating this angularity while still retaining the other features of the alignment system.

Figure 2:
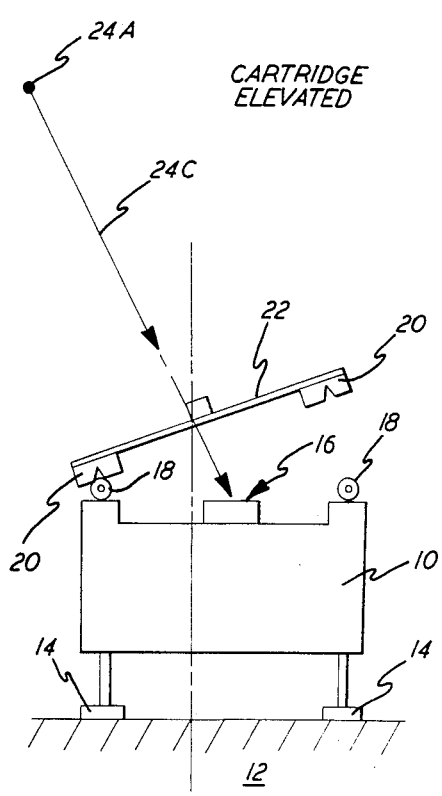
FIG. 2 is a side elevation of a cartridge in its elevated position.

FIG. 2 shows the cartridge 10 in its elevated position. It is noted that the bistable feet 14 have been linearly extended and that one of the balls 18 is in engagement with its V-block, while a second ball is spaced from its corresponding V-block. Actually, this figure has exaggerated the misalignment for purposes of clarity. In the usual situation the ball would not necessarily be actually spaced from its V-block but might engage the side of same without actually bottoming out. It is noted that it is important that linear translation motion of the cartridge must be stable. It must come up linearly in a straight line translation, particularly to facilitate mask capture and release in the mask load-unload station and to engage and disengage with the air gage at that particular work station.

Figure 3:
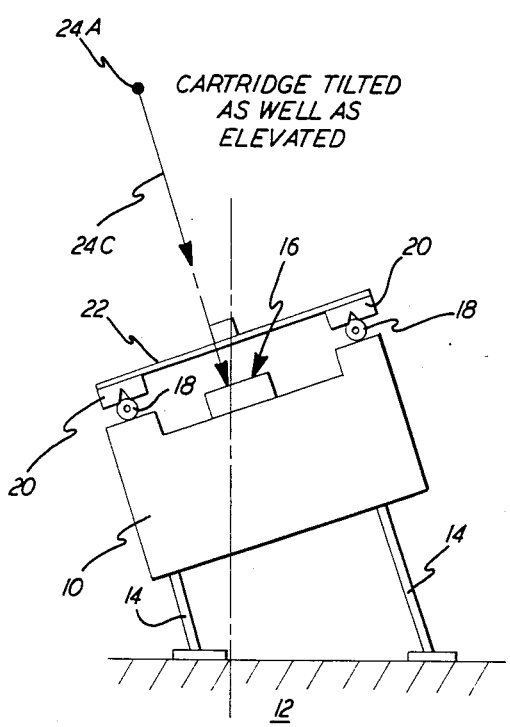
FIG. 3 is a side elevation of a cartridge tilted as well as elevated.

FIG. 3 shows a cartridge 10 in its elevated and tilted position. It is noted that the bistable feet 14 are extended, not necessarily all to the same extent, and are disposed at an angle with respect to the support table 12. In this position all of the balls 18 rest at the bottom of their respective V-blocks 20, thereby accurately aligning the mask and wafer with respect to the cone of X-rays.

Figure 4:
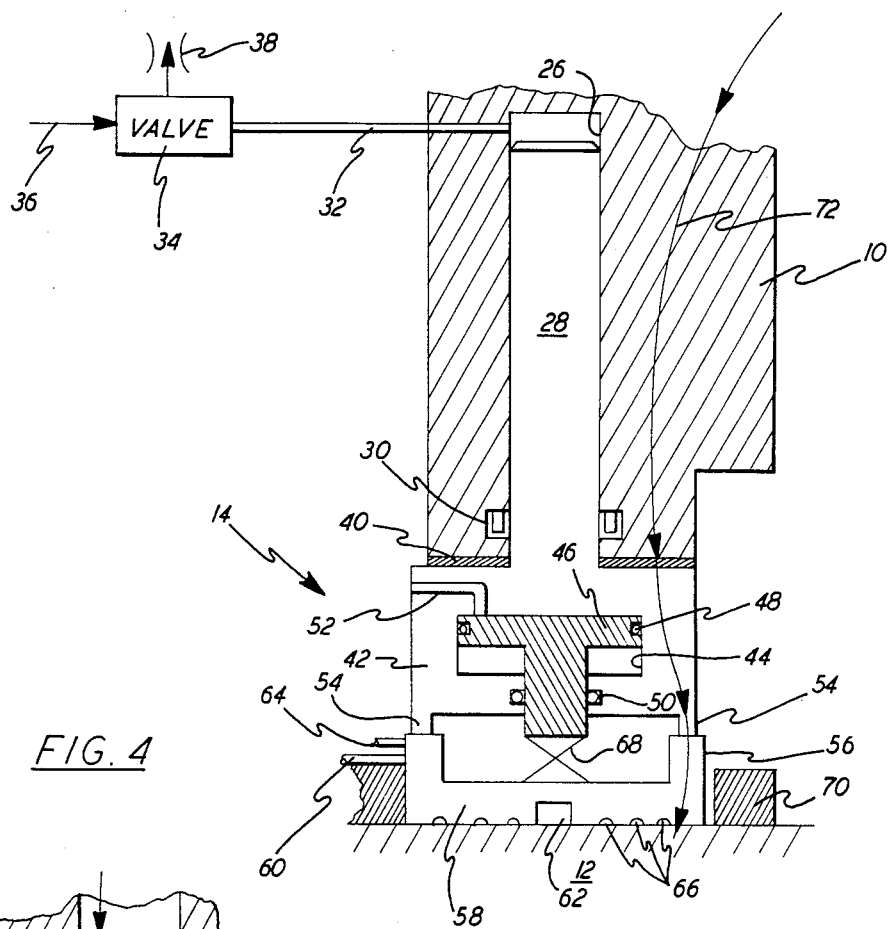
FIG. 4 is an enlarged side elevation of a cartridge carried by a bistable alignment foot in a first position.
Figure 5:
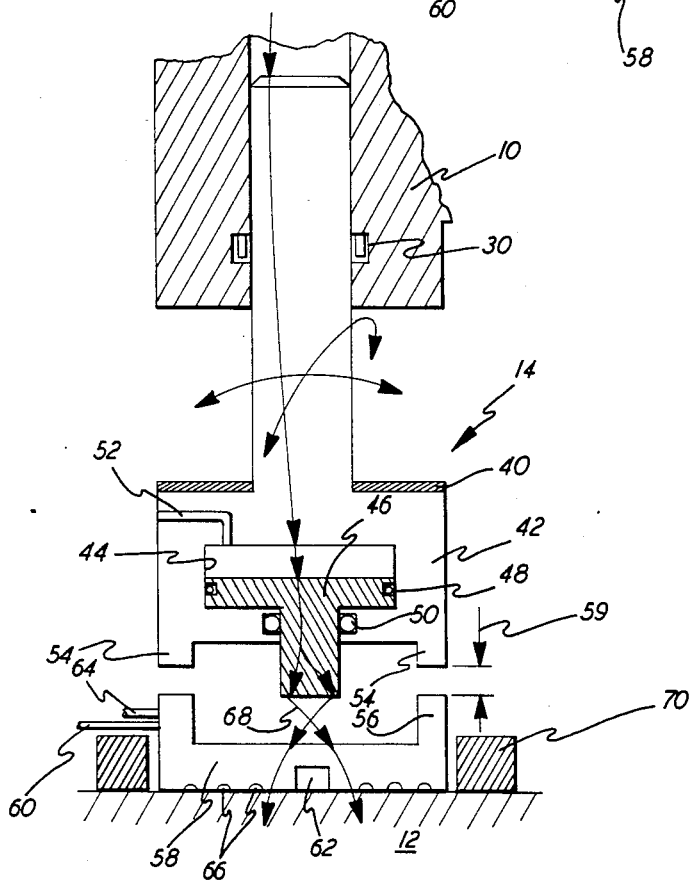
FIG. 5 is an enlarged side elevation of a cartridge carried by a bistable alignment foot in its second position.

FIGS. 4 and 5 illustrate the bistable feet 14 in greater detail. The cartridge 10 has a piston cylinder 26 for receiving a lift piston 28. A Teflon U-cup ring 30 forms a sliding seal between the piston and the cartridge body 10. A pressurized air inlet and exhaust outlet 32 is provided at the upper end of the piston cylinder 26. A valve 34 has a first position wherein air under pressure from a source line 36 is directed to enter the piston chamber through the inlet line 32 and has a second position for exhausting air from the piston cylinder through a restrictor 38. The restrictor serves to cushion the return of the cartridge from its upper to its lower position. In addition, a rubber snubber 40 is interposed between the cartridge body and the lift piston 28 to further cushion the cartridge when engaging the lift piston.

The lift piston 28 has a lower cup portion 42, which has a second piston cylinder 44 for receiving a flexure piston 46. Sealing members 48 and 50 provide a seal between the flexure piston and the cup portion 42. A pressurized air inlet and exhaust outlet 52 is provided at the upper end of the piston cylinder 44. The cup 42 has three spaced feet 54. These feet are formed by cutting away a portion of the depending cylindrical ring. The feet rigidly engage an upper ring portion 56 of a vacuum-air bearing foot 58 when the lift piston is in its lower position, as seen in FIG. 4. In one position thereof the foot rests on the support table 12, and a vacuum inlet 60 provides a vacuum in a channel 62 to firmly hold the foot in place. In a second position of the foot, air under pressure is introduced through inlet 64 to air orifices 66 to thereby provide an air bearing between the foot and the table 12. This air bearing facilitates movement of the cartridge assembly from one work station to the next. If also facilitates angular or tilting movement of the cartridge, as will be discussed more fully hereinafter.

The bottom of the flexure piston 46 is connected to the vacuum-air bearing foot 58 by means of a two axis flexure 68. Surrounding the vacuum-air bearing foot 58 is a track guide 70 for keeping the foot within the track boundries.

With reference to the operation of the bistable foot 14, FIG. 4 shows the foot and cartridge in its lower initial position, such as for example, just after the cartridge has entered the X-ray exposure work station. It is noted that the cartridge 10 is in its lowermost position and is in engagement with the cup portion 42 of the lift piston. The lift piston is in its lowermost position and the feet 54 thereof are in engagement with the ring portion 56 of the vacuum-air bearing foot 58. Normally at this time a vacuum is carried in the vacuum channel 62 to firmly hold the foot against the table. The load path is indicated in FIG. 4 by arrows 72. The load in this case is essentially the weight of the cartridge. The path travels through the cartridge body, through the cup portion 42, through the three feet 54, and through the vacuum-air bearing foot 58 to the support plate 12.

First in the sequence of operations is the energization of the lift piston, which extends the cartridge upwardly as shown in FIGS. 2 and 5 so that the balls 18 initially engage the V-blocks 20. It is noted that the carriage is stably lifted. That is, to obtain this linear mode of elevation, air under pressure is introduced from source 36 through valve 34 and inlet 32 to the piston cylinder 26. At this time the piston 28 is fixed and hence the cartridge 10 is forced upwardly by the reaction force.

Next, the flexure piston 46 is energized and at the same time the air bearing foot 58 is energized so that there is a film of air between the air bearing foot and the support table 12. Thus, air is introduced through the inlet 64 and passes to the orifice 66 to thereby form the air bearing. Air is also introduced through the inlet 52 and passes to the piston cylinder 44 in the cup. Because the flexure piston is substantially fixed, the lift piston and the cartridge body are forced upwardly by the reaction force to their positions, as shown in FIG. 5. It will be appreciated that the force acting on the flexure piston 46 is greater than the force acting on the lift piston 28 in order for the lift piston to move upwardly with respect to the flexure piston, as illustrated in FIG. 5. In this position the bistable foot 14 has compliant capability in order to acommodate angular tilt at the V-blocks of the reaction plate 22, as seen in FIG. 3. At this point in time there is a gap of about 0.030 inches for example between the feet 54 of the cup portion 42 and the ring portion 56 of the vacuum-air bearing foot 58. This gap along with the air foot 58, in effect, provides six degrees of freedom of motion. That is, when the flexure piston is fired it provides three degrees of tilt, while the two axis flexure 68 provides two degrees and the third degree is rotation around the air bearing at the foot. The load path at this point of time, as depicted by arrow 74 in FIG. 5, extends from the cartridge through the pressurized air above the lift piston, through the lift piston, through the pressurized air above the flexure piston, through the flexure piston, through the flexure 68 and through the vacuum-air bearing foot 58 to the support table. The load in this case is the summation of the weight plus the reaction forces. The fact that the load path changes is what makes the body bistable.

In order to return the system to its initial condition upon completion of the work activity in the work station, the foregoing procedure is reversed. Thus, simultaneously the air is released from the air bearing at the foot and from the flexure piston. The lift piston descends and its feet engage the ring portion 56 of the foot 58. Next, the valve 34, FIG. 4, is actuated and the pressure in the piston chamber 26 is released through the outlet pipe 32 and restrictor 38 causing the lift piston to descend. The restrictor 38 serves to prevent the cartridge body from abruptly falling down against the cup portion of the lift piston. The assembly is now ready to move to the next station.

It will thus be seen that the present invention does indeed provide a new and improved bistable foot with which the aligner cartridge can be elevated and retracted with a linear translation motion and still be able to accommodate angular tilt at the reaction plate V-blocks in the elevated mode such that the X-ray beam which is set with respect to these V-blocks is aligned correctly with the mask/wafer combination carried by the cartridge. It also provides a stable system to capture and release the air gage at that work station.

Although a certain particular embodiment of the invention has been herein disclosed for purposes of explanation, various modifications thereof, after study of this specification, will be apparent to those skilled in the art to which the invention pertains.

What is claimed is:

1. In an x-ray lithographic system comprising:
   a plurality of work stations each having substantially identical kinematic mounts;
   a cartridge movably located on support means;
   means for mounting a wafer and a mask on said cartridge;
   means for moving said cartridge between said stations;
   means for moving said cartridge to a kinematic mount;
   an improvement comprising:
   a bistable foot operable in a first linear elevational mode and in a second angular compliance mode to bring said cartridge into contact with said kinematic mounts;
   said bistable foot comprising a first piston means for elevating said cartridge with respect to said support means and a second piston means operable between a first mode wherein said cartridge is rigidly connected to said support means and a second mode wherein said cartridge is flexibly connected to said support means.

2. A system according to claim 1 wherein said support means comprises a foot member and a support table; air bearing means interconnecting said foot member and said support table; and fluid pressure means for actuating said air bearing means.

3. A system according to claim 1, wherein said bistable foot comprises a lift piston mounted for vertical movement within a vertically disposed piston chamber and said cartridge;
   said lift piston having a lower cup portion; said cup portion having a vertically disposed piston chamber;
   a flexure piston mounted in the piston chamber in said cup portion;
   a foot member carried by a support table;
   flexure means connected between said foot member and said flexure piston;
   said cup portion having means for removably, rigidly engaging said foot member;
   first fluid pressure means for elevating said cartridge with respect to said lift piston;
   second fluid pressure means for elevating said lift piston with respect to said flexure piston such that said cup portion disengages said foot member to form a tilting flexible connection therebetween.

4. A system according to claim 3 further comprising air bearing means interconnecting said foot member and said support table, third fluid pressure means for actuating said air bearing means.

* * * * *